(12) United States Patent
Ishida et al.

(10) Patent No.: US 7,528,441 B2
(45) Date of Patent: May 5, 2009

(54) INSULATED GATE SEMICONDUCTOR DEVICE

(75) Inventors: Hiroyasu Ishida, Oura-gun (JP); Tadashi Natsume, Oura-gun (JP)

(73) Assignees: Sanyo Electric Co., Ltd, Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 11/839,293

(22) Filed: Aug. 15, 2007

(65) Prior Publication Data

US 2008/0048255 A1    Feb. 28, 2008

(30) Foreign Application Priority Data

Aug. 23, 2006   (JP) ............... 2006-227042

(51) Int. Cl.
   *H01L 27/108* (2006.01)
(52) U.S. Cl. ........... 257/330; 257/331; 257/332; 257/E27.091
(58) Field of Classification Search ......... 257/330, 257/331, 332, E27.091
   See application file for complete search history.

(56) References Cited

U.S. PATENT DOCUMENTS 6,821,867 B2 *  11/2004  Kouno et al. ............... 438/462
6,930,354 B2 *  8/2005   Shirai et al. ............... 257/330
6,984,864 B2 *  1/2006   Uno et al. .................. 257/382
7,354,342 B2 *  4/2008   Paulsen et al. ............. 463/16

FOREIGN PATENT DOCUMENTS

JP    2002-118258 A    4/2002

* cited by examiner

*Primary Examiner*—Victor A Mandala
(74) *Attorney, Agent, or Firm*—Morrison & Foerster LLP

(57) ABSTRACT

Provided is an insulated gate semiconductor device. In the device, source regions are provided in the entire operation area and a first back gate region is provided below the source region between trenches. Moreover, a second back gate region connected to the first back gate region is provided outside of the source regions. Thereafter, a first electrode layer coming into contact with the source regions is provided in the entire operation area, and a second electrode layer coming into contact with the second back gate regions is provided around the first electrode layer. Accordingly, potentials can be individually applied to the first electrode layer and the second electrode layer. Thus, it is possible to perform control for preventing reverse flow caused by a parasitic diode.

12 Claims, 10 Drawing Sheets

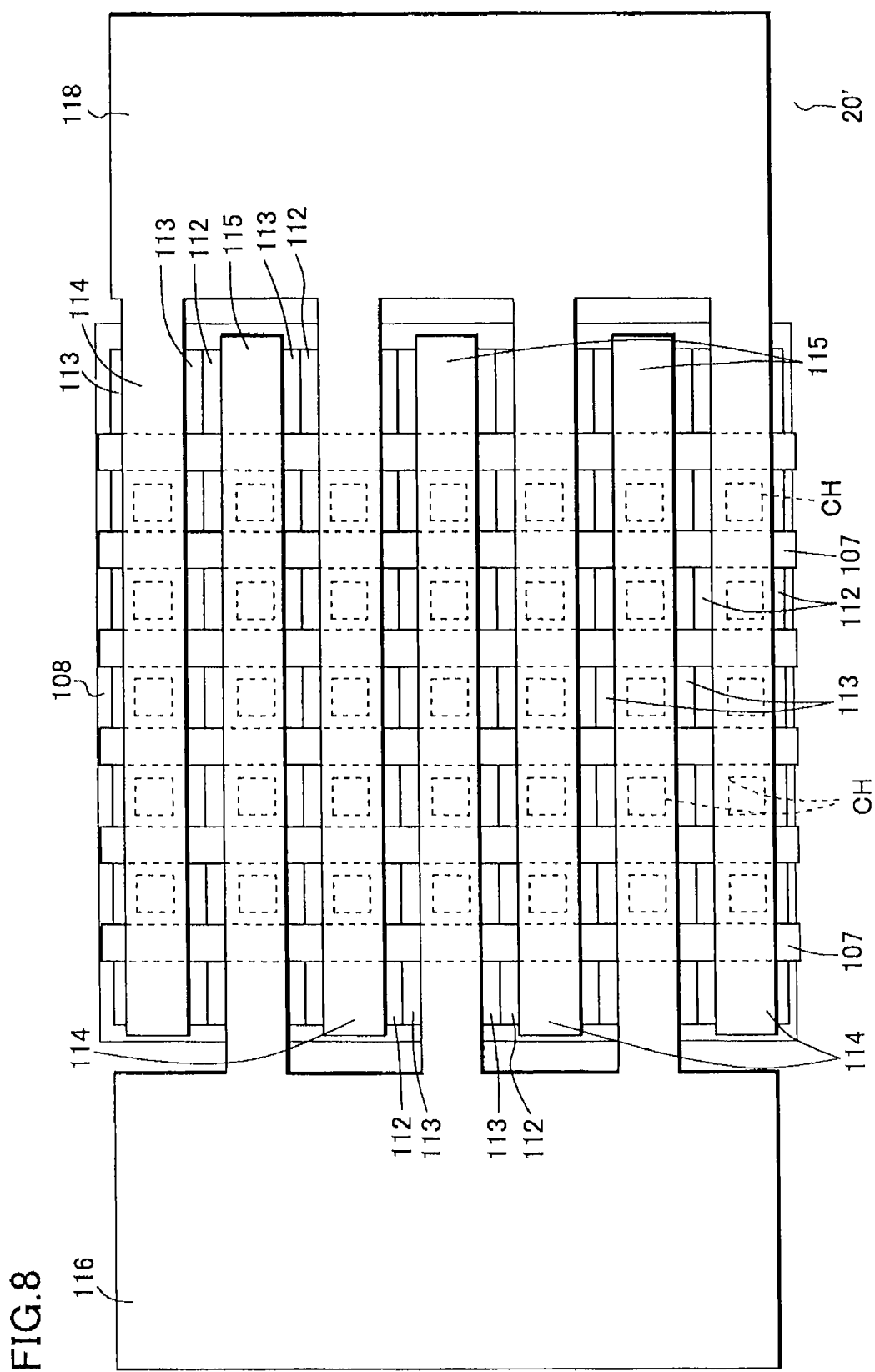

Prior Art

Prior Art

INSULATED GATE SEMICONDUCTOR DEVICE

BACKGROUND OF THE INVENTION

This invention claims priority from Japanese Patent Application Number JP2006-227042 filed on Aug. 23, 2006, the content of which is incorporated herein by reference in its entirety.

1. Field of the Invention

The present invention relates to an insulated gate semiconductor device, and more particularly relates to an insulated gate semiconductor device which enables a bidirectional switching operation in one chip by separating an electrode connected to a back gate region from a source electrode.

2. Description of the Related Art

FIGS. 10A and 10B show an n-channel MOSFET as an example of a conventional semiconductor device. FIG. 10A is a plan view and FIG. 10B is a cross-sectional view along the line e-e in FIG. 10A. Note that, in FIG. 10A, an interlayer insulating film is omitted and a source electrode is indicated by a broken line.

As shown in FIG. 10A, trenches 44 are formed in a stripe pattern on a surface of a substrate, and source regions 48 and body regions 49 are disposed adjacent to the trenches 44. The trenches 44, the source regions 48 and the body regions 49 are extended in the same direction.

As shown in FIG. 10B, in the n-channel MOSFET, a drain region 42 formed of an n− type epitaxial layer is provided on an n+ type semiconductor substrate 41, and a p type channel layer 43 is provided thereon. Moreover, the trenches 44 are provided, which reach the drain region 42 from the channel layer 43. An inner wall of each of the trenches 44 is covered with a gate oxide film 45, and a gate electrode 46 is buried in the trench 44.

In a surface of the channel layer 43 adjacent to the trenches 44, n+ type source regions 48 are formed. Moreover, in the surface of the channel layer 43 between the source regions 48 in two adjacent cells, a p+ type body region 49 is formed. The trenches 44 are covered with an interlayer insulating film 50, and a source electrode 51 is provided thereon, which comes into contact with the source regions 48 and the body regions 49. The source electrode 51 is continuously provided on the source regions 48 and the body regions 49. Moreover, a drain electrode 52 is provided on a rear surface of the substrate.

The MOSFET described above is adopted in a protection circuit device which manages charge and discharge of a secondary battery, for example.

FIG. 11 is a circuit diagram showing an example of the protection circuit device.

Two MOSFETs Q1 and Q2 are series-connected to a secondary battery LiB. The MOSFETs Q1 and Q2 have a common-connected drain D. Moreover, respective sources S thereof are disposed on both ends, and respective gates G thereof are connected to a control circuit IC. The control circuit IC protects the secondary battery LiB from overcharge, overdischarge or load short-circuiting by controlling turning on and off of the two MOSFETs Q1 and Q2 while detecting a voltage of the secondary battery LiB. This technology is described, for instance, in Japanese Patent Application Publication No. 2002-118258.

For example, the control circuit IC prevents overcharge of the secondary battery LiB by detecting the voltage of the battery and switching off the MOSFET Q2 when the detected voltage is higher than a maximum set voltage. Moreover, the control circuit IC prevents overdischarge of the secondary battery LiB by switching off the MOSFET Q1 when the detected voltage is lower than a minimum set voltage.

As shown in FIGS. 10A and 10B, in the conventional MOSFET, the body regions 49 and the source regions 48 are common-connected to the source electrode 51, and potentials thereof are fixed. Moreover, in the case where the MOSFET is to be utilized as a bidirectional switching element, two MOSFETs are series-connected and current paths are formed in both directions by switching potentials of the respective source electrodes 51 thereof.

This is because the MOSFET includes a parasitic diode. Specifically, in the MOSFET in which the potentials of the body region 49 (in other words, a back gate region) and the source region 48 are fixed, a forward operation of the parasitic diode in an off state is inevitable.

Therefore, it is necessary to perform control so as not to allow the parasitic diode to form an unwanted current path when the MOSFET is off.

Thus, as shown in FIG. 11, the two MOSFETs having the same number of cells and the same chip size are series-connected, and the MOSFETs Q1 and Q2 and parasitic diodes thereof are controlled by the control circuit. Accordingly, desired current paths are formed.

Meanwhile, in order to reduce an on-resistance in the MOSFET, a certain number of cells and a certain chip size are required. In the meantime, the secondary battery has become widely used as a battery of a portable terminal. Moreover, along with miniaturization of the portable terminal, there has also been an increasing demand for miniaturization of a protection circuit. However, the above protection circuit having the two series-connected MOSFETs Q1 and Q2 has its limits in meeting the demand.

SUMMARY OF THE INVENTION

The present invention provides an insulated gate semiconductor that includes a semiconductor substrate of a first general conductivity type, a drain region comprising a semiconductor layer of the first general conductivity type disposed on the substrate, a channel layer of a second general conductivity type disposed on the semiconductor layer, trenches formed in the channel layer in a form of stripes extending in a direction parallel to the substrate, gate electrodes disposed in the trenches, source regions formed in the channel layer, each of the source regions being disposed next to a corresponding trench and extending in said direction, first back gate regions of the second general conductivity type formed in the channel layer, each of the first back gate regions being disposed under a corresponding source region, second back gate regions of the second general conductivity type, each of the second back gate regions being connected with a corresponding first back gate region and comprising a top surface of channel layer, a first electrode layer disposed on the source regions, and a second electrode layer disposed on the second back gate regions.

The present invention also provides an insulated gate semiconductor that includes a semiconductor substrate of a first general conductivity type, a drain region comprising a semiconductor layer of the first general conductivity type disposed on the substrate, a channel layer of a second general conductivity type disposed on the semiconductor layer, gate electrodes disposed on the channel layer in a form of stripes extending in a direction parallel to the substrate, source regions formed in the channel layer, each of the source regions being disposed adjacent a corresponding gate electrode and extending in said direction, first back gate regions of the second general conductivity type formed in the channel layer, each of the first back gate regions being disposed under a corresponding source region, second back gate regions of the second general conductivity type, each of the second back gate regions being connected with a corresponding first back gate region and comprising a top surface of channel layer, a first electrode layer disposed on the source regions, and a second electrode layer disposed on the second back gate regions.

BRIEF DESCRIPTION OF THE DRAWINGS

FIG. 8 is a plan view showing another insulated gate semiconductor device for comparing with the insulated gate semiconductor device of the first embodiment of the present invention.

DESCRIPTION OF THE EMBODIMENTS

With reference to FIGS. 1 to 9, embodiments of the present invention will be described by taking an n-channel MOSFET having a trench structure, as an example.

Figure 1A:
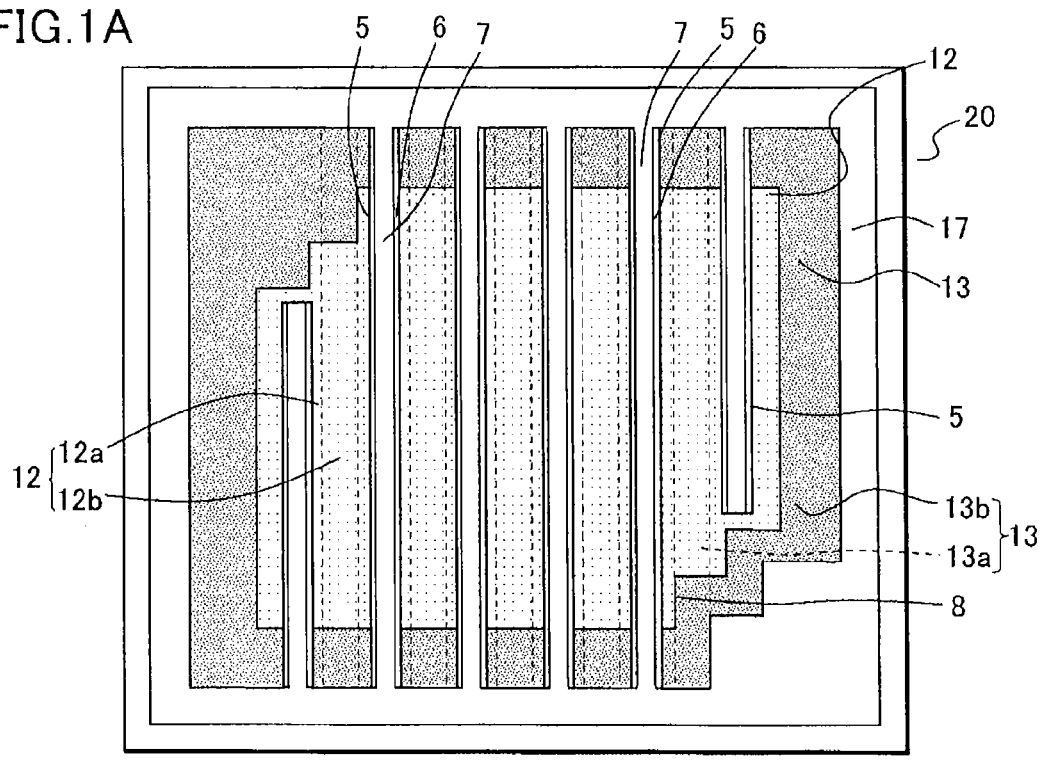
FIGS. 1A and 1B are plan views showing an insulated gate semiconductor device of a first embodiment of the present invention.
Figure 1B:
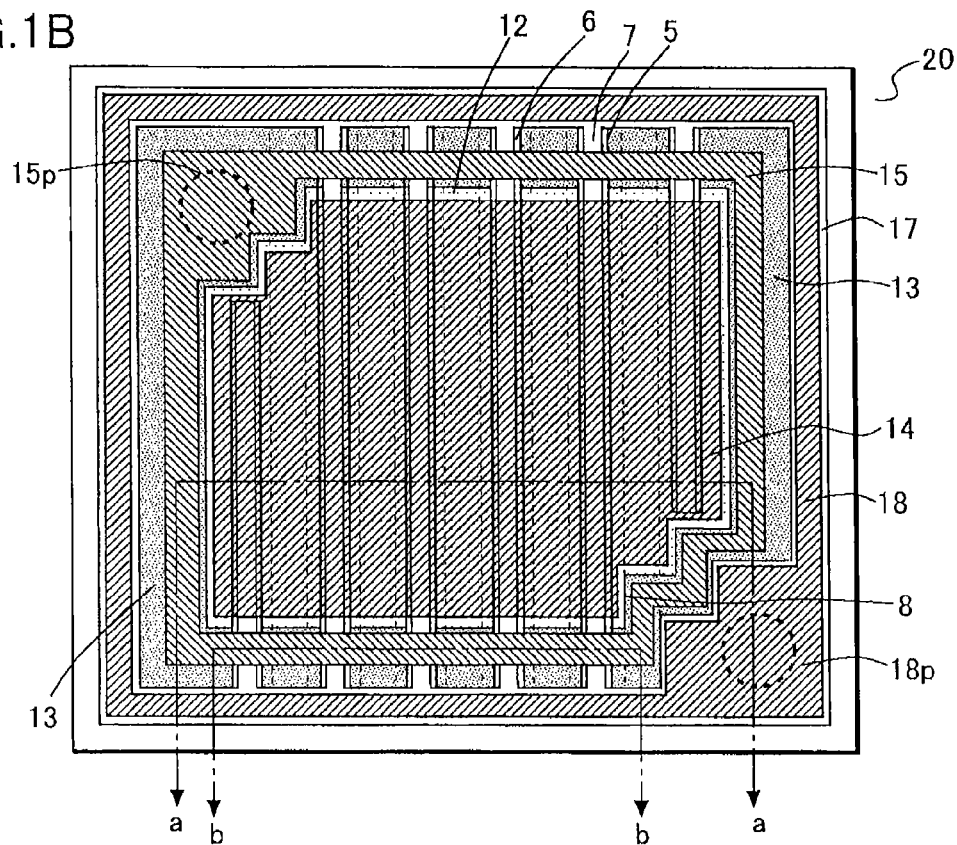

First, with reference to FIGS. 1 to 8, a first embodiment will be described. FIGS. 1A and 1B are plan views showing a MOSFET. An electrode layer on a surface and an interlayer insulating film are omitted in FIG. 1A, and the electrode layer on the surface is illustrated in FIG. 1B.

A MOSFET 20 includes a semiconductor substrate 1, a semiconductor layer 2, a channel layer 3, trenches 5, gate insulating films 6, gate electrodes 7, source regions 12, back gate regions 13, an interlayer insulating film 10, a first electrode layer 14, a second electrode layer 15 and a third electrode layer 16.

An n− type semiconductor layer is disposed on an n+ type silicon semiconductor substrate, and the channel layer 3 that is a p type impurity region is provided thereon. The trenches 5 are formed in a stripe pattern extended in a first direction in a surface pattern of the channel layer 3. Each of the trenches 5 has its inner wall covered with the gate insulating film 6 corresponding to a drive voltage. The gate electrodes 7 are obtained by burying polysilicon in the trenches 5, the polysilicon having a resistance lowered by introducing impurities.

It is noted that conductivity types such as $n^+$, n and $n^-$ belong to one general conductivity type, and conductivity types such as $p^+$, p and $p^-$ belong to another general conductivity type.

The source regions 12 are provided by diffusing high-concentration n type (n+ type) impurities in the surface of the channel layer 3. Each of the source regions 12 is provided in the surface of the channel layer 3 between the trenches 5. Specifically, the source region 12 is continuous between the adjacent trenches 5, and includes first source regions 12a and a second source region 12b. The first source regions 12a are provided adjacent to the trenches 5. The second source region 12b is provided in a region indicated by broken lines in FIG. 1A, and is continuous with two of the first source regions 12a provided between the adjacent trenches 5.

The back gate regions 13 are high-concentration p type (p+ type) impurity regions and include first back gate regions 13a and second back gate regions 13b. Each of the first back gate regions 13a is provided below the second source region 12b in the channel layer 3. Specifically, in the region indicated by the broken lines in FIG. 1A, the second source regions 12b are provided in the surface of the channel layer and the first back gate regions 13a are provided therebelow.

The second back gate regions 13b are provided in the surface of the channel layer 3 in a outside of the source regions 12. The first back gate regions 13a are extended to the outside of the source regions 12 and integrated with the second back gate regions 13b. The first and second back gate regions 13a and 13b are electrically connected to each other. Note that, in this embodiment, an area up to where the source regions 12, the first back gate regions 13a and the gate electrodes 7 are disposed and where the transistor is operated (in other words, up to peripheral ends of the source regions 12) is set to be an operation area 8.

The gate electrodes 7 in the trenches 5 are drawn out to the outside of the operation area 8 and extended as a gate extraction electrode 17 around the second back gate regions 13b.

With reference to FIG. 1B, the first electrode layer 14 and the second electrode layer 15 will be described. The first electrode layer 14 is a source electrode having a shape of one flat plate and is provided so as to cover the source regions 12 and the gate electrodes 7 in the operation area 8. The interlayer insulating film (not shown) is provided on the gate electrodes 7, and the first electrode layer 14 comes into contact with the source regions 12 (the second source regions 12b) which are exposed from contact holes provided in the interlayer insulating film. The whole first electrode layer 14 having the flat plate shape is an electrode pad, and a source potential is applied thereto by fixing bonding wires or the like thereto at desired positions.

Meanwhile, the second electrode layer 15 is a back gate electrode provided on the second back gate regions 13b around the first electrode layer 14. The second electrode layer 15 comes into contact with the second back gate regions 13b and is also electrically connected to the first back gate regions 13a. In the second electrode layer 15, an electrode pad region 15p for the back gate electrode is secured, for example, in a chip corner portion or the like. Accordingly, a back gate potential is applied to the second electrode layer 15 by fixing a bonding wire or the like to the electrode pad region 15p as indicated by a broken circle. Note that, below the electrode pad region 15p, the second back gate region 13b is provided in a pattern overlapping therewith. The second electrode layer 15 is formed of the same metal layer as that of the first electrode layer 14, for example.

On the gate extraction electrode 17 surrounding the second electrode layer 15, a gate wiring 18 and an electrode pad region 18p for the gate electrodes are provided by use of the same metal layer as that of the first and second electrode layers 14 and 15. A gate potential is applied to the electrode pad region 18p, for example, by fixing a bonding wire or the like thereto as indicated by a broken circle.

Figure 2:
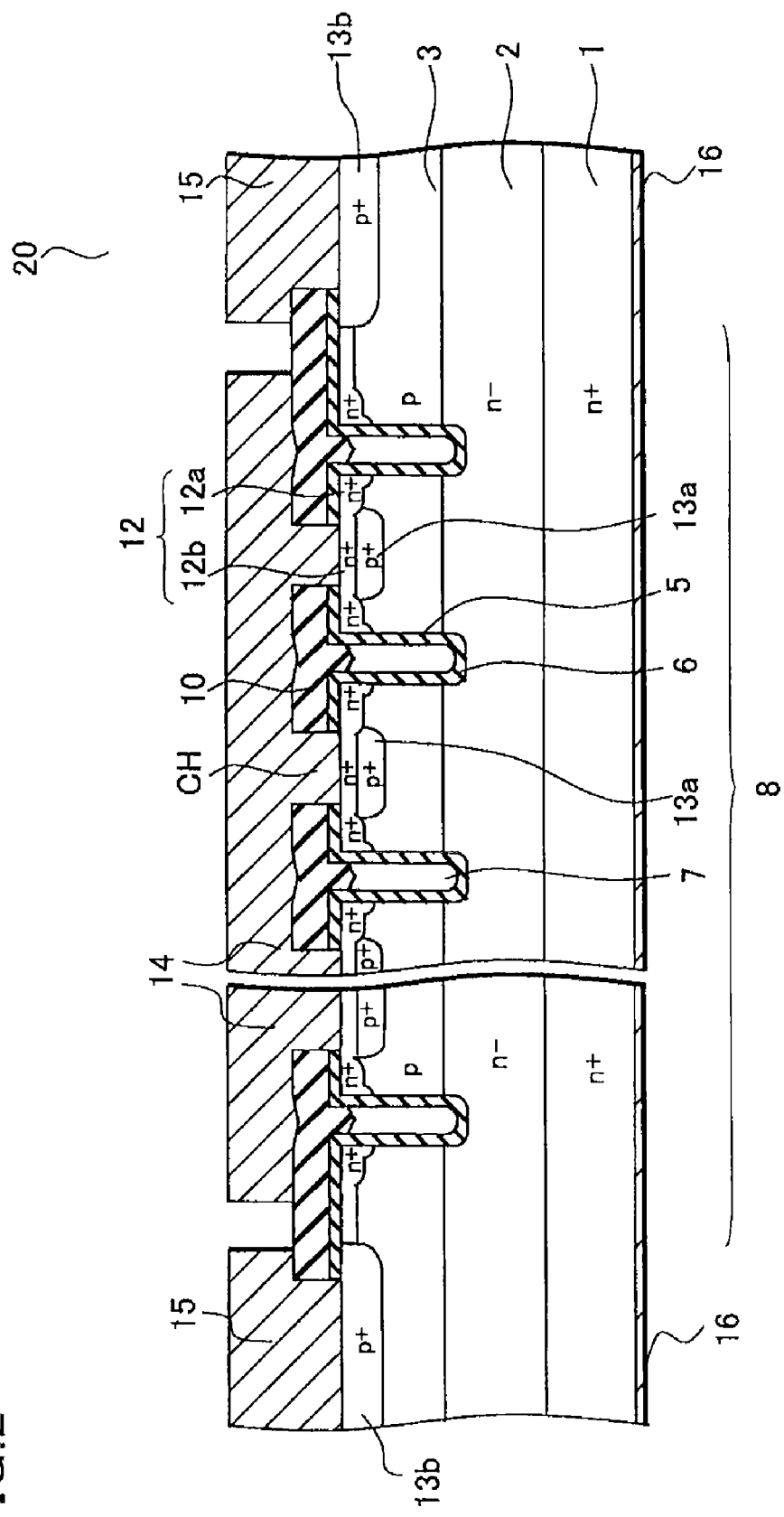
FIG. 2 is a cross-sectional view showing the insulated gate semiconductor device of the first embodiment of the present invention.
Figure 3:
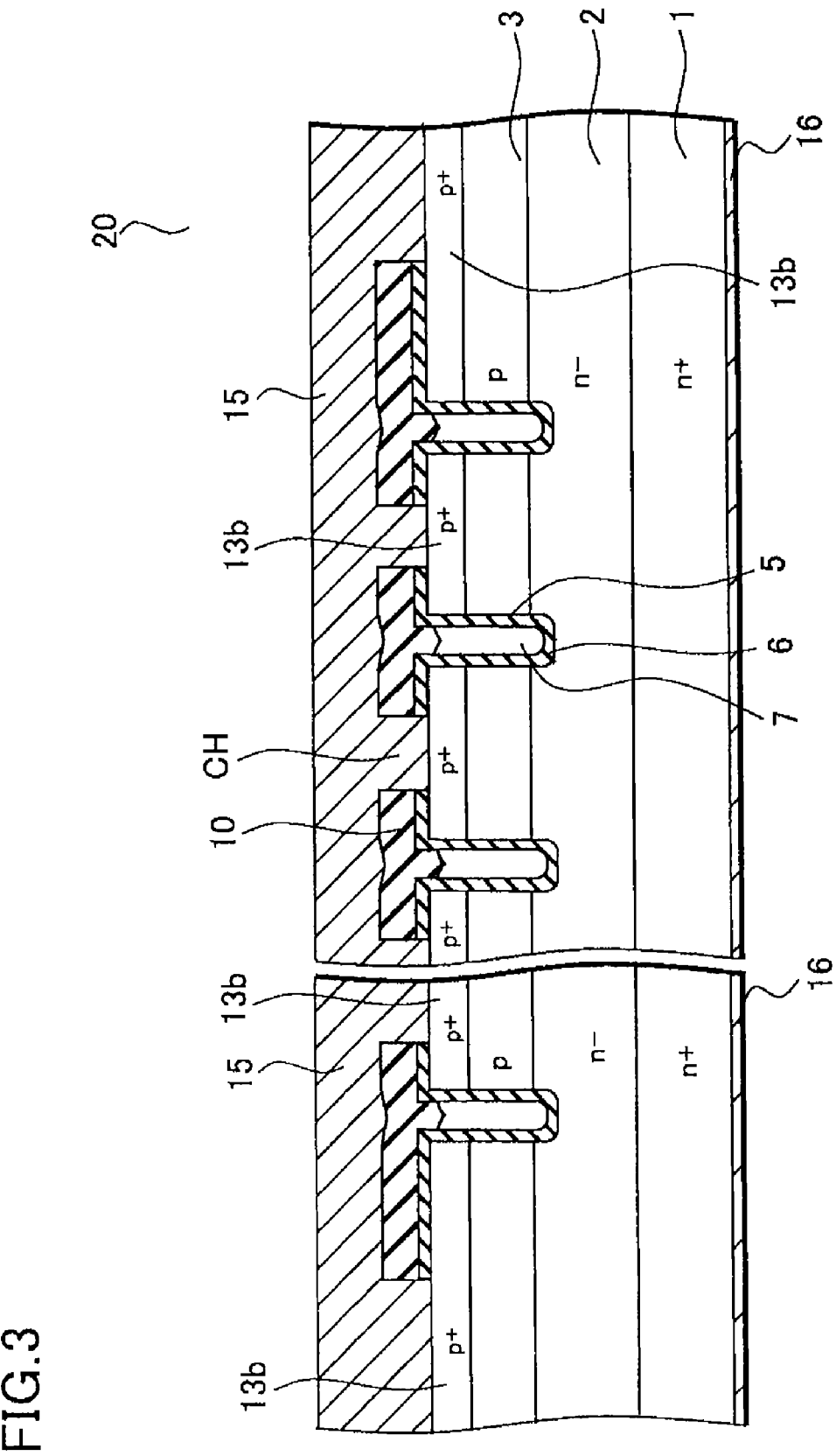
FIG. 3 is a cross-sectional view showing the insulated gate semiconductor device of the first embodiment of the present invention.

FIGS. 2 and 3 are cross-sectional views of this embodiment. FIG. 2 is a cross-sectional view along the line a-a in FIG. 1B, and FIG. 3 is a cross-sectional view along the line b-b in FIG. 1B.

As the substrate, a drain region is provided by laminating the n− type semiconductor layer 2 on the n+ type silicon semiconductor substrate 1 or the like. The n− type semiconductor layer 2 is, for example, an epitaxial layer. In the surface of the n− type semiconductor layer 2, the channel layer 3 that is the p type impurity region is provided. The trenches 5 are provided so as to penetrate the channel layer 3 and to have a depth reaching the n− type semiconductor layer 2.

On the inner wall of each of the trenches 5, the gate insulating film (oxide film) 6 having a thickness corresponding to the drive voltage is provided. Moreover, the gate electrode 7 is buried in the trench 5, the gate electrode having a resistance lowered by implanting impurities into a polysilicon layer.

With reference to FIG. 2, in the cross-section along the line a-a in FIG. 1B, the first source regions 12a are provided adjacent to the trenches 5. Moreover, the second source region 12b is provided between the first source regions 12a adjacent to each other and is continuous with the first source regions 12a on both sides thereof. The second source region 12b is formed to have the same depth as that of the first source region 12a. However, since the first back gate region 13a provided below the second source region 12b is diffused also upward, the depth of the second source region 12b is eventually made shallower than that of the first source region 12a.

As to the back gate region 13, the first back gate region 13a is provided between the gate electrodes 7 adjacent to each other, and the second back gate region 13b is provided in the outside of the source region 12. The first back gate region 13a is positioned below the second source region 12b in the channel layer 3.

On the gate electrodes 7, the interlayer insulating film 10 is provided. The interlayer insulating film 10 covers up to the first source regions 12a. Moreover, the first electrode layer 14 is provided thereon. Specifically, the second source region 12b is exposed from the surface of the channel layer 3 and comes into contact with the first electrode layer 14 through the contact hole CH of the interlayer insulating film 10.

The second electrode layer (the back gate electrode) 15 is provided on the second back gate regions 13b provided around the operation area 8 (the source regions 12). The second back gate regions 13b are exposed from the surface of the channel layer 3 and come into contact with the second electrode layer 15.

On the rear surface of the n+ type semiconductor substrate 1, the third electrode layer 16 (drain electrode) is provided.

Moreover, with reference to FIG. 3, in the cross-section along the line b-b in FIG. 1B (outside of the operation area 8), only the second back gate region 13b is provided between the adjacent trenches 5 and comes into contact with the second electrode layer 15 disposed thereon.

The first back gate regions 13a are extended to the outside of the source regions 12, integrated with the second back gate regions 13b and electrically connected to the second back gate regions 13b and the second electrode layer 15.

According to this embodiment, in one chip of the MOSFET 20, a potential to be applied to the first electrode layer 14 and a potential to be applied to the second electrode layer 15 can be individually controlled. Specifically, relationships between the potentials of the source regions 12 and the back gate regions 13 can be individually controlled.

Thus, the MOSFET 20 of this embodiment can realize in one chip a bidirectional switching element which switches a current path between two directions. This will be described below.

Figure 4:
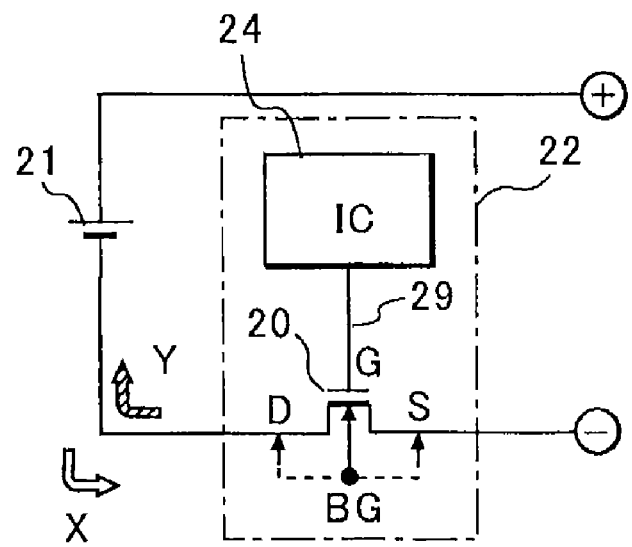
FIG. 4 is a circuit diagram showing the insulated gate semiconductor device of the first embodiment of the present invention.
Figure 5:
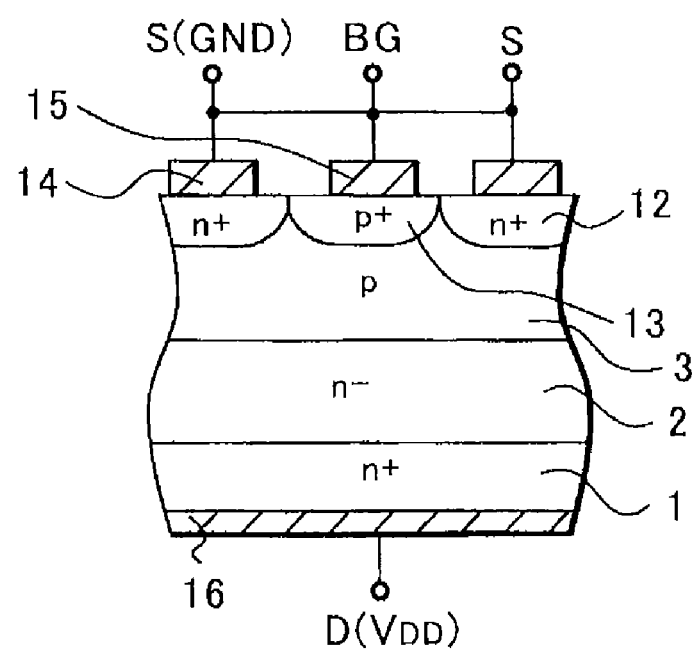
FIG. 5 is a schematic diagram showing the insulated gate semiconductor device of the first embodiment of the present invention.
Figure 6:
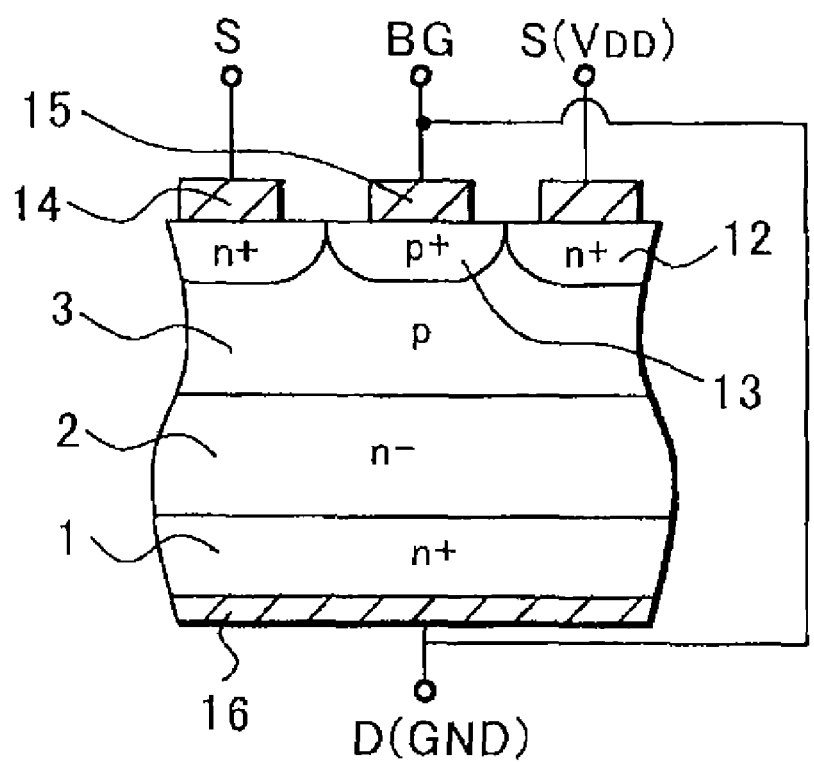
FIG. 6 is a schematic diagram showing the insulated gate semiconductor device of the first embodiment of the present invention.

FIGS. 4 to 6 show an example of the case where the MOSFET 20 shown in FIGS. 1A and 1B is used as the bidirectional switching element. FIG. 4 is a circuit diagram showing a protection circuit for a secondary battery. FIGS. 5 and 6 are schematic diagrams showing the case where the MOSFET 20 is in an off state.

As shown in FIG. 4, a protection circuit 22 includes one MOSFET 20 that is the switching element and a control circuit 24.

The MOSFET 20 is series-connected to a secondary battery 21 and performs charge and discharge of the secondary battery 21. In the MOSFET 20, current paths are formed in two directions.

The control circuit 24 includes one control terminal 29 which applies a control signal to a gate G of the MOSFET 20.

In the case of charge and discharge operations, the control circuit 24 switches on the MOSFET 20 and allows currents to flow in a direction of charging the secondary battery 21 and in a direction of discharging the secondary battery 21 according to potentials of a source S and a drain D of the MOSFET. Moreover, for example, when the charge and discharge operations are off, when switching is performed between charge and discharge, and the like, the MOSFET 20 is set in the off state. Moreover, in this event, parasitic diodes included in the MOSFET 20 form a current path in a direction opposite to that of a desired path. However, in this embodiment, the current path in the opposite direction is cut off. Specifically, when the MOSFET 20 is off, any one of terminals, either the source S or the drain D, which has a lower potential is connected to a back gate BG as indicated by broken arrows. Thus, the current path formed by the parasitic diode is cut off.

To be more specific, in the case of charging, the drain D is set to have a power source potential VDD and the source S is set to have a ground potential GND. Thereafter, the MOSFET 20 is turned on by applying a predetermined potential to the gate G. Thus, a current path is formed in a charging direction (arrow X).

In the case of discharging, the drain D is set to have the ground potential GND and the source S is set to have the power source potential VDD. Thereafter, the MOSFET 20 is turned on by applying the predetermined potential to the gate G. Thus, a current path is formed in a discharging direction (arrow Y).

Next, with reference to FIGS. 5 and 6, the off state of the MOSFET 20 will be described. FIG. 5 shows the case where the MOSFET 20 is turned off during charging, and FIG. 6 shows the case where the MOSFET 20 is turned off during discharging. Note that FIGS. 5 and 6 are schematic diagrams for explaining operations of this embodiment by schematically showing a relationship between the third electrode layer 16 and the first and second electrode layers 14 and 15 which are connected to the source region 12 and the back gate region 13, respectively. Therefore, the schematic diagrams of FIGS. 5 and 6 do not completely correspond to the cross-sectional view of this embodiment shown in FIG. 2.

As shown in FIG. 5, when the MOSFET 20 is turned off in a charge state such as in switching from charge to discharge or in overcharge, the source S and the back gate BG are short-circuited by the control circuit 24.

In this case, the power source potential VDD is applied to the drain electrode (the drain D) that is the third electrode layer 16, and the second electrode layer 15 (the back gate BG) and the first electrode layer 14 (the source S) are short-circuited and grounded. Since the drain D has the power source potential VDD, a parasitic diode formed by the p type channel layer 3 and the n type substrate (the n+ type semiconductor substrate 1 and the n− type semiconductor layer 2) is set in a reverse bias state. Specifically, since a current path formed by the parasitic diode is cut off, reverse flow can be prevented. Moreover, the drain D has the potential higher than that of the back gate BG and thus no parasitic bipolar operation occurs.

Meanwhile, as shown in FIG. 6, when the MOSFET 20 is turned off in a discharge state such as in switching from discharge to charge or in overdischarge, the drain D and the back gate BG are short-circuited by the control circuit 24.

In this case, the drain electrode 16 (the drain D) and the second electrode layer 15 (the back gate BG) are short-circuited and grounded, and the power source potential VDD is applied to the first electrode layer 14 (the source S).

Since the source S has the power source potential VDD, the parasitic diode is set in the reverse bias state. Accordingly, since the current path formed by the parasitic diode is cut off, reverse flow can be prevented. Moreover, the drain D and the back gate BG have the same potential and thus no parasitic bipolar operation occurs.

As described above, in this embodiment, the first electrode layer 14 connected to the source region 12 and the second electrode layer 15 connected to the back gate region 13 are individually formed. Therefore, bidirectional switching can be controlled by applying a predetermined potential to each of the first and second electrode layers 14 and 15 and by using one MOSFET 20.

Figure 7A:
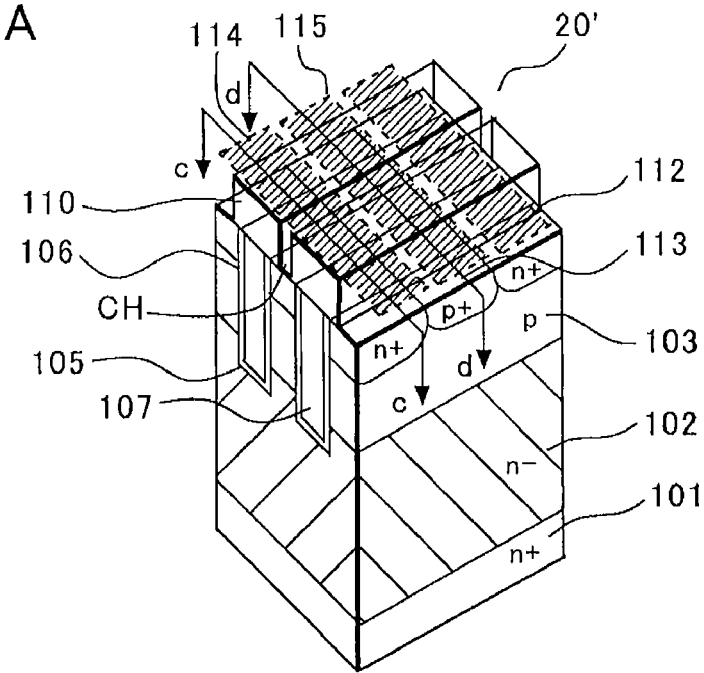
FIG. 7A is a perspective view and FIGS. 7B and 7C are cross-sectional views showing another insulated gate semiconductor device for comparing with the insulated gate semiconductor device of the first embodiment of the present invention.
Figure 7B:
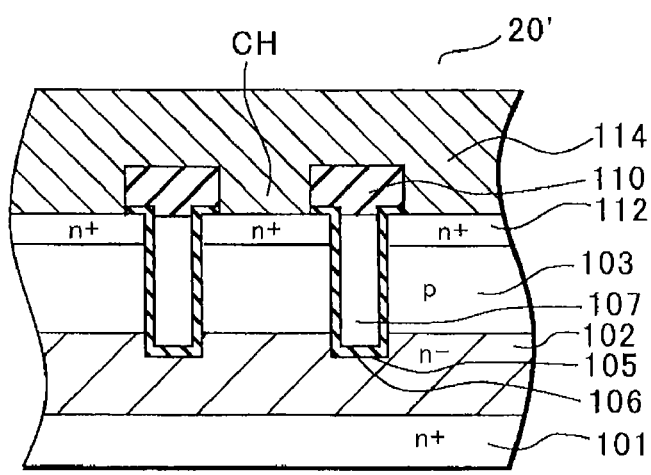
Figure 7C:
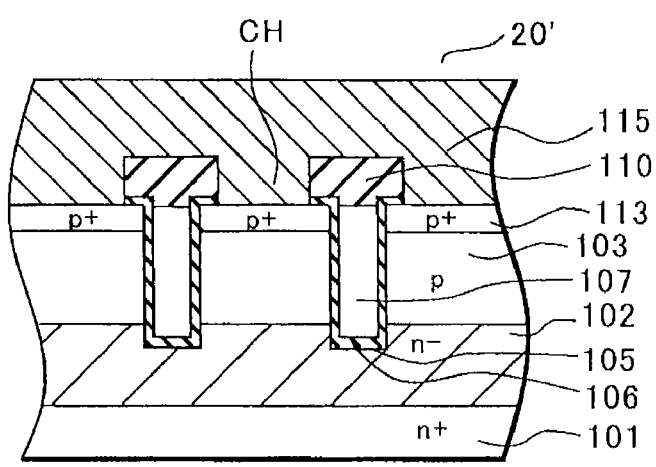

FIGS. 7 and 8 show a comparative example to explain merits of the embodiment of the invention. FIGS. 7A to 7C show the MOSFET 20'. FIG. 7A is a perspective view and FIGS. 7B and 7C are cross-sectional views along the line c-c and the line d-d in FIG. 7A, respectively.

With reference to FIGS. 7A to 7C, a drain region is provided by laminating an n− type semiconductor layer 102 on an n+ type semiconductor substrate 101, and a channel layer 103 is provided thereon. Trenches 105 in a stripe pattern are extended in a first direction. After inner walls of the trenches are covered with gate oxide films 106, gate electrodes 107 are buried therein. Source regions 112 and back gate regions 113 are provided in a surface of the channel layer 103 and extended in a second direction perpendicular to the trenches 105. Moreover, the source regions 112 and the back gate regions 113 are alternately arranged along the direction in which the trenches 105 are extended.

The gate electrodes 107 are covered with an interlayer insulating film 110. On the source regions 112 and the back gate regions 113, first electrode layers 114 and second electrode layers 115, which come into contact with those regions, are disposed in the same pattern (broken lines), respectively. Note that FIG. 7A shows only the pattern of the first and second electrode layers 114 and 115. However, in reality, the first electrode layers 114 come into contact with the source regions 112 through contact holes CH as shown in FIG. 7B, and the second electrode layers 115 come into contact with the back gate regions 113 through contact holes CH as shown in FIG. 7C.

FIG. 8 is a schematic plan view of an operation area 108 where the gate electrodes 107 and the source regions 112 are arranged in the MOSFET 20' shown in FIGS. 7A to 7C.

The first electrode layers 114 and the second electrode layers 115 are alternately arranged in a direction perpendicular to the trenches 105 and the gate electrodes 107 in the operation area 108, and are connected to a first electrode pad 118 and a second electrode pad 116, respectively, outside of the operation area 108.

As described above, the first electrode layers 114 coming into contact with the source regions 112 and the second electrode layers 115 coming into contact with the back gate regions 113 are separated from each other and extended in the direction different from that in which the trenches 105 are extended. Thus, potentials can be individually applied to the first electrode layers 114 and the second electrode layers 115.

Therefore, control for preventing reverse flow caused by a parasitic diode can be performed by the same operations as those described with reference to FIGS. 4 to 6. Thus, one MOSFET can realize a bidirectional switching element.

However, in this case, since the first electrode layers 114 and the second electrode layers 115 are alternately arranged in the operation area 108, respective line widths are reduced. Thus, a resistance is generally increased.

On the other hand, in the embodiment of this invention, the flat plate-like first electrode layer 14 covering almost the entire surfaces of the source regions 12 is provided, and the second source regions 12b are allowed to come into contact with the first electrode layer 14. Moreover, as to the back gate regions 13, the second back gate regions 13b are connected to the second electrode layer 15 outside of the operation area 8.

Thus, all the second source regions 12b exposed in the operation area 8 can come into contact with the first electrode layer 14. Moreover, in the operation area 8, only one flat plate-like first electrode layer 14 is disposed. Therefore, compared with the structure of the comparative example in which the first electrode layers 114 and the second electrode layers 115 are alternately patterned in the operation area 108 as shown in FIGS. 7A to 7C, it is not necessary to give consideration to an alignment allowance for patterning masks. Moreover, since more currents can flow through the flat plate-like first electrode layer 14, a wiring resistance can be reduced. Thus, the on-resistance of this embodiment is lower than that of the comparative example.

Figure 9:
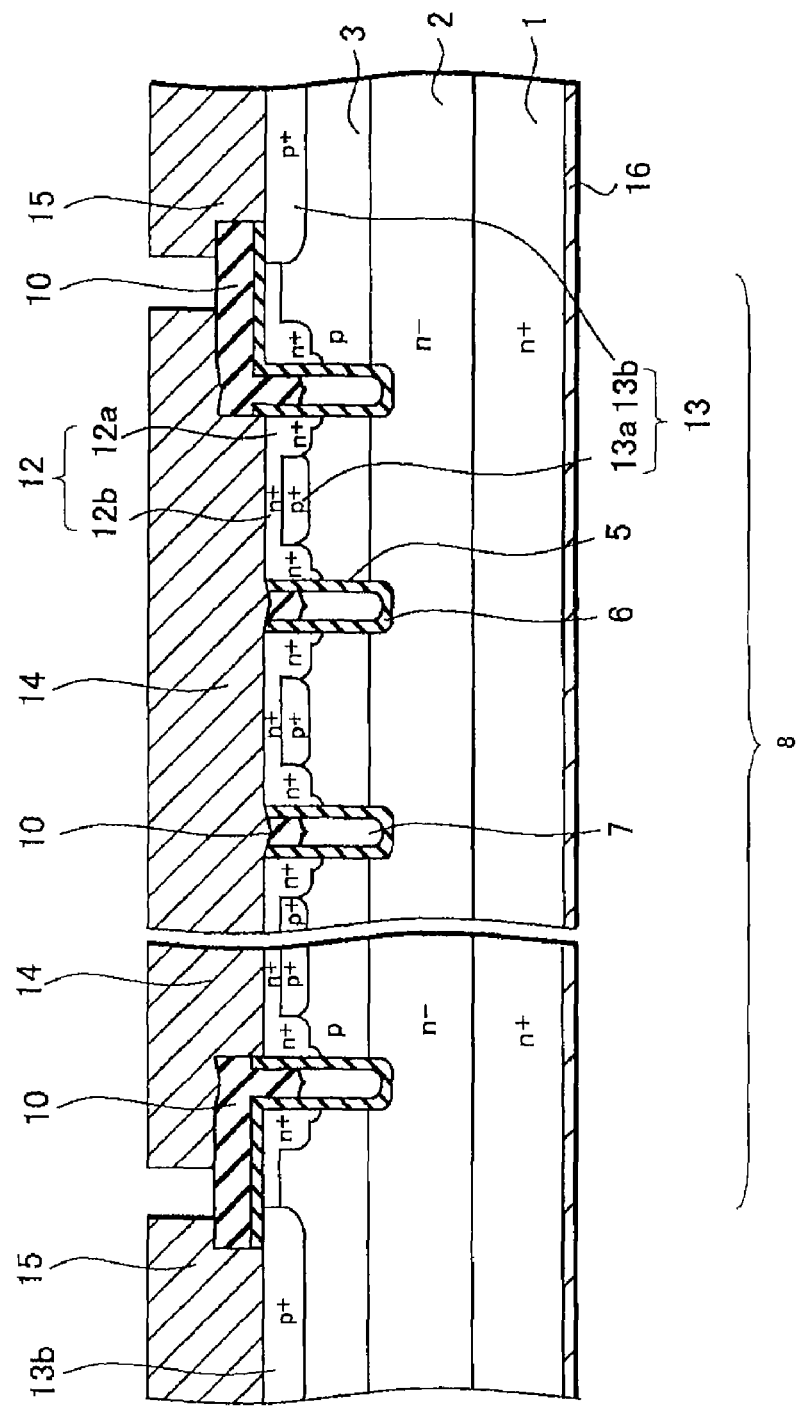
FIG. 9 is a cross-sectional view showing an insulated gate semiconductor device of a second embodiment of the present invention.
Figure 10A:
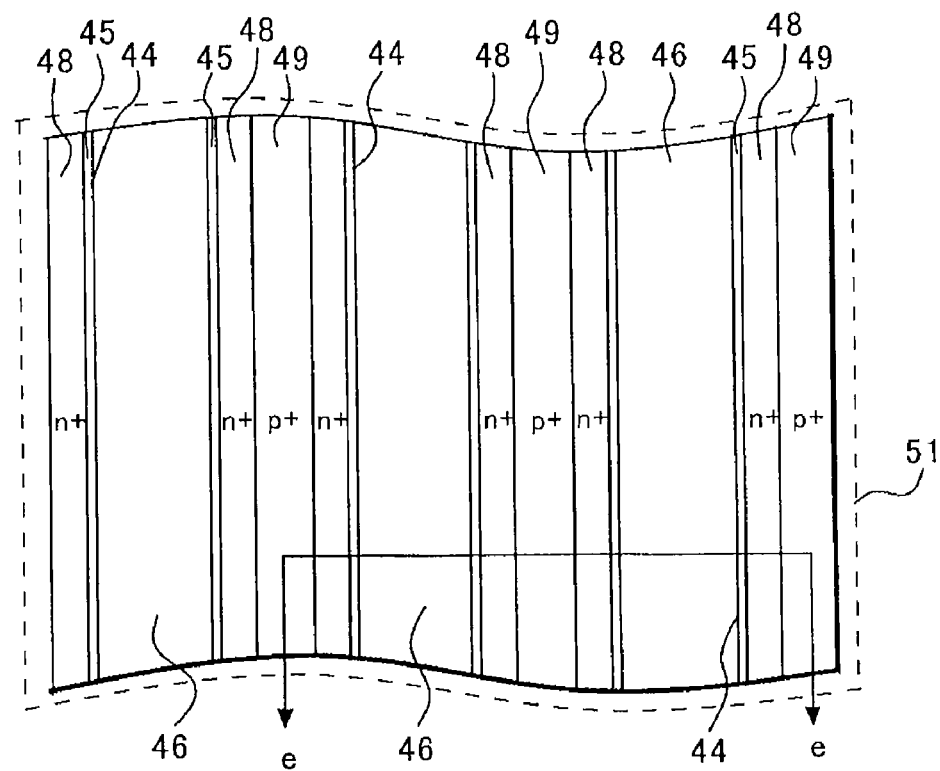
FIG. 10A is a plan view and FIG. 10B is a cross-sectional view showing a conventional insulated gate semiconductor device.
Figure 10B:
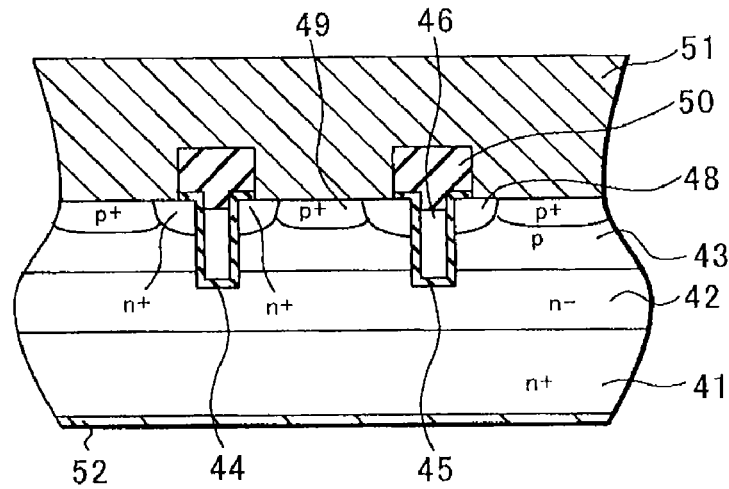
Figure 11:
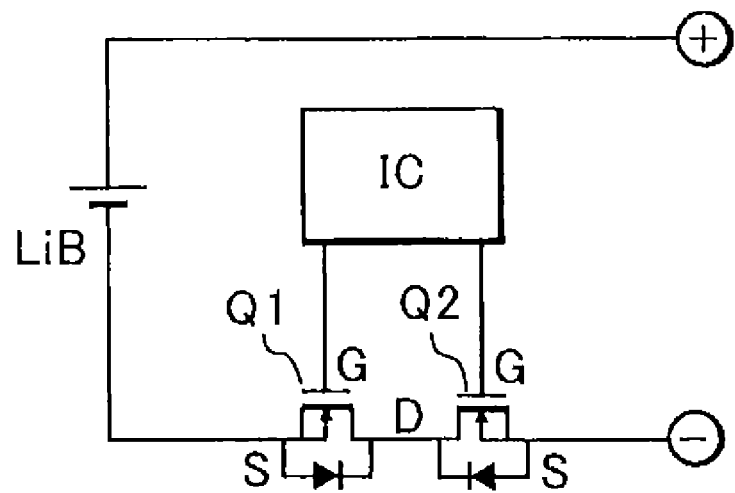
FIG. 11 is a circuit diagram showing a conventional insulated gate semiconductor device.

FIG. 9 is a cross-sectional view corresponding to FIG. 2 and showing a second embodiment of the present invention. In the second embodiment, interlayer insulating films 10 are buried in trenches 5. As to the same constituent components as those in the first embodiment, description thereof will be omitted.

Each of gate electrodes 7 has its upper part provided at a position lower by about several thousand Å than an opening of the trench 5, in other words, a surface of a channel layer 3. Each of first source regions 12a is provided in the surface of the channel layer 3 around the opening of the trench 5. Moreover, a part of the first source region 12a is extended in a depth direction of the trench 5 along a sidewall thereof, and is provided to have a depth reaching the gate electrode 7 with a gate insulating film 6 interposed therebetween.

Except for peripheral ends of an operation area 8, each of the interlayer insulating films 10 is overall buried in the trench 5. The gate electrode 7 has its upper end (surface) positioned lower by about several thousand Å than the surface of the channel layer 3. The interlayer insulating film 10 is near completely buried in the trench 5 from the upper end of the gate electrode 7 to the surface of the channel layer 3. Thus, the interlayer insulating film 10 has no portion protruding to a substrate surface.

A first electrode layer 14 is provided so as to be approximately flat on the gate electrodes 7 and the interlayer insulating films 10, and comes into contact with source regions 12. Thus, it is possible to prevent voids caused by deterioration in step coverage or cracks in wire bonding. Consequently, reliability is improved.

Furthermore, the first source regions 12a covered with the interlayer insulating film 10 in the first embodiment are also exposed from the surface of the channel layer 3 in the second embodiment and thus can come into contact with the first electrode layer 14. Consequently, it is possible to contribute to reduction in an on-resistance.

Furthermore, although not shown in the drawings, also in a cross-section corresponding to FIG. 3, a second electrode layer 15 is provided so as to be approximately flat on the gate electrodes 7 and the interlayer insulating films 10, and comes into contact with back gate regions 13.

Thus, it is possible to prevent voids caused by deterioration in step coverage or cracks in wire bonding. Moreover, a contact resistance of the back gate regions 13 can be reduced.

Note that, although the above description was given by taking the n-channel MOSFET as an example in the embodiments of the present invention, the present invention is also applicable to a p-channel MOSFET having a conductivity type inverted. Furthermore, without being limited to the MOSFET having the trench structure, the present invention can be similarly implemented for a MOSFET having a planar structure in which gate electrodes are provided in a surface of a channel layer with gate insulating films interposed therebetween.

According to the embodiments of the present invention, first, the source electrode and the drain electrode can be individually connected to the back gate region. Thus, one MOSFET can switch between a state where the source region and the back gate region are short-circuited and a state where the drain region and the back gate region are short-circuited.

Thus, it is possible to cut off an unwanted current path (a current path in a direction opposite to that of a desired current path) which is formed by a parasitic diode when the MOSFET is off.

Therefore, one MOSFET chip can switch the current path between two directions and prevent reverse current flow.

Second, the first electrode layer (the source electrode) can come into contact with almost the entire surfaces of the source regions exposed in the operation area. Therefore, the on-resistance is reduced compared with the structure in which the first and second electrode layers are alternately arranged in the operation area and the source electrodes and the drain electrodes are individually connected to the back gate regions. Thus, a current capacity can be increased.

Third, by burying the interlayer insulating films in the trenches, the substrate surface with which the first electrode layer comes into contact can be planarized. Specifically, since there is no step coverage by the interlayer insulating films, high adhesion can also be secured. Moreover, in the embodiments of the present invention, the source regions are provided in almost the entire operation area except for the gate electrodes. Thus, a contact area between the source regions and the first electrode layer is increased. Consequently, the on-resistance can also be reduced.

Fourth, one MOSFET chip can realize an element capable of performing a bidirectional switching operation. For example, in such a case as where the MOSFET is adopted in a protection circuit for a secondary battery, reduction in the number of parts and miniaturization of the device can be realized.

What is claimed is:

1. An insulated gate semiconductor device comprising:
   a semiconductor substrate of a first general conductivity type;
   a drain region comprising a semiconductor layer of the first general conductivity type disposed on the substrate;
   a channel layer of a second general conductivity type disposed on the semiconductor layer;
   trenches formed in the channel layer in a form of stripes extending in a direction parallel to the substrate;
   gate electrodes disposed in the trenches;
   source regions formed in the channel layer, each of the source regions being disposed next to a corresponding trench and extending in said direction;
   first back gate regions of the second general conductivity type formed in the channel layer, each of the first back gate regions being disposed under a corresponding source region;
   second back gate regions of the second general conductivity type, each of the second back gate regions being connected with a corresponding first back gate region and comprising a top surface of channel layer;
   a first electrode layer disposed on the source regions; and
   a second electrode layer disposed on the second back gate regions and physically separated from the first electrode layer.

2. The insulated gate semiconductor device of claim 1, wherein the first electrode layer has a shape of one flat plate and covers the source regions and the gate electrodes.

3. The insulated gate semiconductor device of claim 1, wherein the second back gate region is in contact with the second electrode layer.

4. The insulated gate semiconductor device of claim 1, wherein, according to potentials of the source region and the drain region, current paths are formed in two directions between the source region and the drain region under voltage application to the gate electrode.

5. The insulated gate semiconductor device according to claim 1, wherein interlayer insulating films are provided between the gate electrodes and the first electrode layer and are disposed in the trenches.

6. An insulated gate semiconductor device comprising:
   a semiconductor substrate of a first general conductivity type;
   a drain region comprising a semiconductor layer of the first general conductivity type disposed on the substrate;
   a channel layer of a second general conductivity type disposed on the semiconductor layer;
   trenches formed in the channel layer in a form of stripes extending in a direction parallel to the substrate;
   gate electrodes disposed in the trenches;
   source regions formed in the channel layer, each of the source regions being disposed next to a corresponding trench and extending in said direction;
   first back gate regions of the second general conductivity type formed in the channel layer, each of the first back gate regions being disposed under a corresponding source region;
   second back gate regions of the second general conductivity type, each of the second back gate regions being connected with a corresponding first back gate region and comprising a top surface of channel layer;
   a first electrode layer disposed on the source regions; and a second electrode layer disposed on the second back gate regions,
wherein the second electrode layer surrounds the first electrode layer.

7. An insulated gate semiconductor device comprising:
a semiconductor substrate of a first general conductivity type;
a drain region comprising a semiconductor layer of the first general conductivity type disposed on the substrate;
a channel layer of a second general conductivity type disposed on the semiconductor layer;
trenches formed in the channel layer in a form of stripes extending in a direction parallel to the substrate;
gate electrodes disposed in the trenches;
source regions formed in the channel layer, each of the source regions being disposed next to a corresponding trench and extending in said direction;
first back gate regions of the second general conductivity type formed in the channel layer, each of the first back gate regions being disposed under a corresponding source region;
second back gate regions of the second general conductivity type, each of the second back gate regions being connected with a corresponding first back gate region and comprising a top surface of channel layer;
a first electrode layer disposed on the source regions; and
a second electrode layer disposed on the second back gate regions,
wherein each of the source regions comprises two first source regions adjacent corresponding trenches and a second source region between the two first source regions, and the first back gate region is disposed below the second source region.

8. The insulated gate semiconductor device of claim 7, wherein the second source region is in contact with the first electrode layer.

9. An insulated gate semiconductor device comprising:
a semiconductor substrate of a first general conductivity type;
a drain region comprising a semiconductor layer of the first general conductivity type disposed on the substrate;
a channel layer of a second general conductivity type disposed on the semiconductor layer;
trenches formed in the channel layer in a form of stripes extending in a direction parallel to the substrate;
gate electrodes disposed in the trenches;
source regions formed in the channel layer, each of the source regions being disposed next to a corresponding trench and extending in said direction;
first back gate regions of the second general conductivity type formed in the channel layer, each of the first back gate regions being disposed under a corresponding source region;
second back gate regions of the second general conductivity type, each of the second back gate regions being connected with a corresponding first back gate region and comprising a top surface of channel layer;
a first electrode layer disposed on the source regions;
a second electrode layer disposed on the second back gate regions; and
a third electrode layer connected with the drain region,
wherein, when no voltage is applied to the gate electrodes, the first electrode layer or the third electrode layer is electrically connected with the second electrode layer.

10. The insulated gate semiconductor device of claim 9, wherein one of the first electrode layer and the third electrode layer, which has a lower potential, is connected with the second electrode layer.

11. The insulated gate semiconductor device of claim 9, wherein a power supply voltage is applied to one of the first electrode layer and the third electrode layer, which is not electrically connected with the second electrode layer.

12. An insulated gate semiconductor device comprising:
a semiconductor substrate of a first general conductivity type;
a drain region comprising a semiconductor layer of the first general conductivity type disposed on the substrate;
a channel layer of a second general conductivity type disposed on the semiconductor layer;
gate electrodes disposed on the channel layer in a form of stripes extending in a direction parallel to the substrate;
source regions formed in the channel layer, each of the source regions being disposed adjacent a corresponding gate electrode and extending in said direction;
first back gate regions of the second general conductivity type formed in the channel layer, each of the first back gate regions being disposed under a corresponding source region;
second back gate regions of the second general conductivity type, each of the second back gate regions being connected with a corresponding first back gate region and comprising a top surface of channel layer;
a first electrode layer disposed on the source regions; and
a second electrode layer disposed on the second back gate regions and physically separated from the first electrode layer.

* * * * *